United States Patent [19]
Nunokawa

[11] Patent Number: 6,060,914
[45] Date of Patent: May 9, 2000

[54] SEMICONDUCTOR DEVICE INCLUDING A BOOST CIRCUIT

[75] Inventor: Hideo Nunokawa, Kawasaki, Japan

[73] Assignee: Fujitsu Limited, Kawasaki, Japan

[21] Appl. No.: 09/131,778

[22] Filed: Aug. 10, 1998

[30] Foreign Application Priority Data

Jan. 29, 1998 [JP] Japan .................................. 10-017404

[51] Int. Cl.[7] ................................................. G11C 27/02
[52] U.S. Cl. ............................................. 327/91; 327/309
[58] Field of Search ................................ 327/91, 93, 94, 327/309, 321, 589; 341/121

[56] References Cited

U.S. PATENT DOCUMENTS

| | | | |
|---|---|---|---|
| 4,886,986 | 12/1989 | Watanabe ................................. | 327/94 |
| 5,338,988 | 8/1994 | Yamamura et al. ..................... | 327/306 |
| 5,502,410 | 3/1996 | Dunn et al. ............................. | 327/140 |
| 5,734,276 | 3/1998 | Abdi et al. ............................... | 327/94 |

*Primary Examiner*—My-Trang Nuton
*Attorney, Agent, or Firm*—Armstrong, Westerman, Hattori, McLeland & Naughton

[57] ABSTRACT

A semiconductor device includes a sample and hold circuit which has an analog switch and a first capacitor and which samples and holds an analog input signal, and a boost circuit which has a boost part which boosts a sampling clock pulse and a clamp part which limits a boosted voltage to a predetermined level. The sample and hold circuit operates a boosted sampling clock pulse. The boost circuit includes a control circuit which operates the clamp part only at the moment the sampling clock pulse changes to a high level.

11 Claims, 8 Drawing Sheets

SEMICONDUCTOR DEVICE INCLUDING A BOOST CIRCUIT

BACKGROUND OF THE INVENTION

1. Field of the Invention

The present invention generally relates to semiconductor devices, and particularly, to a semiconductor device equipped with an analog-to-digital (A/D) converter which operates with a low power supply voltage. More specifically, the present invention is concerned with a semiconductor device having an A/D converter equipped with a gate boost circuit which applies a boosted voltage to a gate of a transistor forming an analog switch of a sample and hold circuit in order to reduce the ON resistance of the transistor.

Recently, it has been required to develop a low power consumption, high density, high reliability, high quality semiconductor device in order to reduce energy consumed in electronic devices.

2. Description of the Related Art

In general, the A/D converter includes a sample and hold circuit, which is located in an analog signal input part and is made up of an analog switch and a capacitor. When the analog switch is ON, an analog input signal is applied to the capacitor of the sample and hold circuit. While the analog signal is being converted into a digital signal, the analog input voltage across the capacitor is maintained at a constant level. Hence, the analog signal can accurately be converted into the digital signal.

A ON/OFF control of the analog switch is carried out so that a sampling clock pulse is applied to the gates of transistors forming the analog switch at constant intervals. If the sampling clock pulse does not have a sufficiently high voltage, the analog switch will have a high ON resistance, which may cause the A/D converter to malfunction. By taking into consideration the above, the conventional A/D converter is equipped with a gate boost circuit, which boosts the voltage of the sampling clock pulse applied to the gates of the transistors forming the analog switch.

FIG. 1 is a circuit diagram of a sample and hold circuit 10 and a gate boost circuit 18, which circuits are provided in a conventional A/D converter. The gate boost circuit 18 is generally made up of a boost part 11, a level converter 12, a clamp part 13, and inverters 14, 15 and 16.

The boost part 11 is made up of a capacitor C1 and a P-channel field effect transistor P1 such as a MOS transistor. The source of the transistor P1 is connected to a power supply voltage VDD. A sampling pulse is applied to an input terminal a, and is boosted by a level approximately equal to the power supply voltage VDD due to the function of the capacitor C1 of the boost part 11.

The level converter 12 is made up of N-channel transistors Q2, Q3 and Q4 and P-channel transistors P5, P6 and P7. The level converter 12, which is provided at the output side of the boost part 11, outputs the high-level voltage of the sampling clock boosted by the boost part 11 as it stands, and converts the low-level voltage of the sampling clock into 0V. Due to the operation of the level converter 12, an analog switch 10a, which is made up of a P-channel MOS transistor P8 and an N-channel MOS transistor Q5, is supplied with the high-level and low-level signals certainly defined. Hence, the analog switch 10a is correctly turned ON and OFF.

The clamp part 13 is made up of an N-channel transistor Q1 and P-channel transistors P2, P3 and P4. As shown in FIG. 1, when the high-level signal is applied to the gate of the transistor Q1, the transistors P2, P3 and P4 are turned ON. Hence, a pass-through current can flow in the clamp part 13 from a node n3. If the clamp part 13 is not provided and the sampling clock has an excessively high voltage, the voltage of the node n3 is further boosted, the transistors connected to the node n3 will receive a voltage higher than the breakdown voltages thereof. The clamp part 13 allows the pass-through current to flow therein from the node n3 when the voltage of the node n3 becomes equal or higher than a predetermined level. Hence, the transistors connected to the node 3 can be prevented from being damaged.

The inverters 14, 15 and 16 function to invert the respective input signals and to shape the signal waveforms.

As shown in FIG. 1, the sample and hold circuit 10 is made up of the analog switch 10a and a capacitor C2 for the sample and hold operation. As described before, the analog switch 10a is made up of the transistors P8 and Q5. A node n6 of the gate boost circuit 18 is connected to the gate of the transistor Q5, and a node n5 thereof is connected to the gate of the transistor P8.

The two inverters 14 and 15 are provided between the input terminal a and the gate of the transistor Q5, while only the inverter 16 is provided between the input terminal a and the gate of the transistor P8. Hence, the transistors Q5 and P8 are simultaneously turned ON and OFF. When the sampling clock is at the high level, the transistors Q5 and P8 are both ON, and thus the analog switch 10a is ON. Thus, an analog input signal applied to an input terminal b reaches the capacitor C2. When the sampling clock is at the low level, the transistors Q5 and P8 are both OFF, and thus the analog switch 10b is OFF. Thus, the signal voltage applied to the capacitor C2 before the transistors Q5 and P8 are turned OFF is held in the capacitor C2.

As described above, the ON resistance of the analog switch 10a can be reduced by boosting the sampling clock pulse for controlling the analog switch 10a by the gate boost circuit 18. Further, the clamp part 13 prevents the boosted voltage of the sampling clock pulse output by the boost part 11 from exceeding the predetermined level and prevents the transistors from receiving a voltage exceeding the breakdown voltages thereof.

However, the circuit shown in FIG. 1 has a disadvantage in that the pass-through current flows in the clamp part 13 while the sampling clock pulse is at the high level and power is consumed for the above period. This is because the sampling clock pulse is directly applied to the gate of the transistor Q1 which functions as the switch provided in the clamp part 13.

There is another disadvantage as described below. The transistors Q5 and P8 may made to have a comparatively thick channel width in order to prevent occurrence of differences in the performance of the individual A/D converters due to errors caused in the production of transistors forming the A/D converters and to reduce noise. However, an increase in the channel width increases the threshold voltages of the transistors. Hence, use of transistors having a comparatively wide channel width makes it difficult to produce A/D converters which can operate with a relative low driving voltage. Particularly, it is very difficult to reduce the channel width of the transistor P8, which is not connected to the gate boost circuit 18 and receives the not-boosted signal via the gate.

SUMMARY OF THE INVENTION

It is a general object of the present invention to provide a semiconductor device in which the above disadvantages are eliminated.

A more specific object of the present invention is to provide a semiconductor device equipped with an A/D converter which operates with a relatively low driving (power supply) voltage and consumes a reduced amount of power in which a gate boost circuit provided in the A/D converter allows a pass-through current to flow therein only at the moment a sampling clock pulse is switched to a high level.

Another object of the present invention is to provide a semiconductor device equipped with an A/ converter having transistors which form an analog switch and have a reduced channel width.

The above objects of the present invention are achieved by a semiconductor device comprising: a sample and hold circuit which has an analog switch and a first capacitor and which samples and holds an analog input signal; and a boost circuit which has a boost part which boosts a sampling clock pulse and a clamp part which limits a boosted voltage to a predetermined level, the sample and hold circuit operating a boosted sampling clock pulse. The boost circuit comprises a control circuit which operates the clamp part only at the moment the sampling clock pulse changes to a high level.

The above semiconductor device may be configured so that: the control part comprises a differentiating circuit which differentiates the sampling clock pulse; and the clamp circuit being operated based on an output signal of the differentiating circuit.

The semiconductor device may be configured so that the differentiating circuit comprises a second capacitor and a resistor.

The semiconductor device may be configured so that the boost part comprises: a second capacitor; and a P-channel transistor having a gate which receives the sampling clock pulse via the second capacitor, a source receiving a power supply voltage, and a drain connected to the clamp part.

The semiconductor device may be configured so that the differentiating circuit comprises a third capacitor and a resistor.

The semiconductor device may be configured so that the boost part comprises: a second capacitor; a first P-channel transistor having a first gate, a first source receiving a power supply voltage, a first drain connected to the first gate; and a second P-channel transistor having a second gate connected to the first gate and the control circuit, a second source connected to the first drain, and a second drain receiving the sampling clock pulse via the second capacitor.

The semiconductor device may be configured so that the differentiating circuit comprises a third capacitor and a resistor.

The semiconductor device may be configured so that the sample and hold circuit comprises a resistor via which the analog input signal is applied to the first capacitor via the analog switch.

The semiconductor device may be configured so that: the analog switch comprises a P-channel transistor and an N-channel transistor; and gates of the P-channel and N-channel transistors are controlled based on the boosted sampling clock pulse.

The semiconductor device may further comprise a level converter which changes the boosted sampling clock pulse to a given level.

The semiconductor device may be configured so that the control circuit prevents the boost part and the clamp part from simultaneously operating.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will be given of the principle of the present invention.

The present invention employs a gate boost circuit having a differentiating circuit, which applies a boosted voltage to an analog switch of a sample and hold circuit provided in an A/D converter. Hence, the analog switch receives a boosted voltage which can be generated with a comparatively low power consumption and has a reduced ON resistance. Also, a resistor is provided in series to the analog switch. Hence, the channel width of transistors forming the analog switch can be reduced without any problem about differences in the performance of different A/D converters and reduction in the effect of absorbing noise. Hence, the threshold level of the analog switch can be minimized and the amount of power consumed in the A/D converter can further be reduced.

Figure 2:
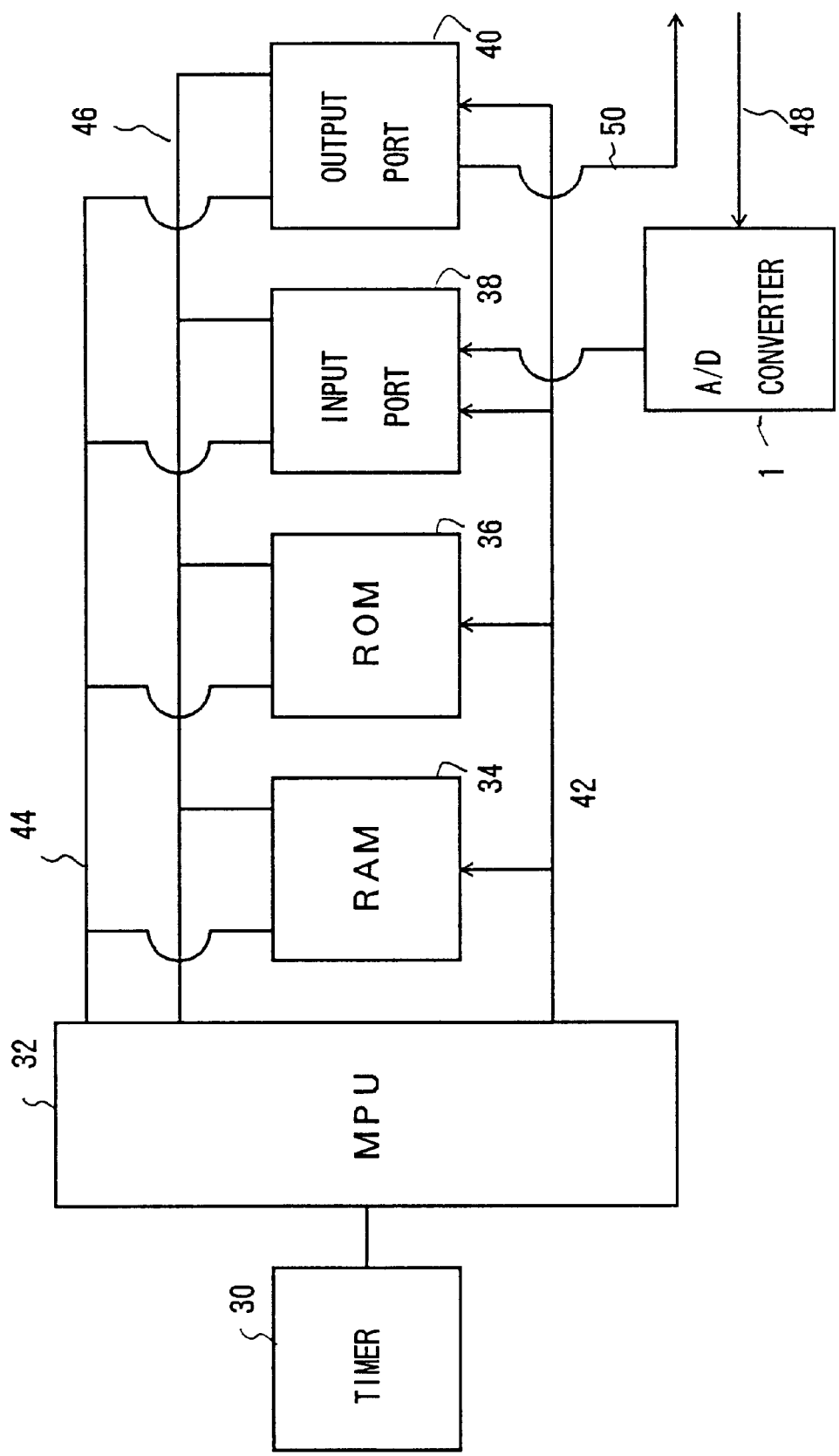
FIG. 2 is a block diagram of a microcomputer having an A/D converter.

FIG. 2 is a block diagram of a semiconductor device equipped with an A/D converter 1. More particularly, the semiconductor device shown in FIG. 2 is a microcomputer.

The microcomputer shown in FIG. 2 includes a control bus 42, an address bus 44, and a data bus 46, which buses connect a MPU 32, a RAM 34, a ROM 36, an input port 38, an output port 40, a timer 30 and the A/D converter 1.

The timer 30 is connected to the MPU 32 and sends a pulse to the MPU 32 with a constant period. The MPU 32 fetches a command applied thereto and executes an operation based on the command. Further, the MPU 32 generates control signals necessary to execute the command. Thus, the RAM 34, the ROM 36, the input port 38 and the output port 40 are controlled by the MPU 32. The RAM 34 serves as a work area for the MPU 32, and the ROM 36 stores programs and data. The input port 38 and the output port 40 interface with external devices or circuits, which are, for example, a data source and a data destination. Analog input data 48 is converted into digital data by the A/D converter 1. The digital data thus generated is then output to the input port 38. Output data 50 is output to an external device or circuit via the output port 40.

The MPU 32 instructs read and write operations on the memories via the control bus 42. An address signal generated by the MPU 32 is transferred via the address bus 44, and a data signal is transferred over the data bus 46.

Figure 3:
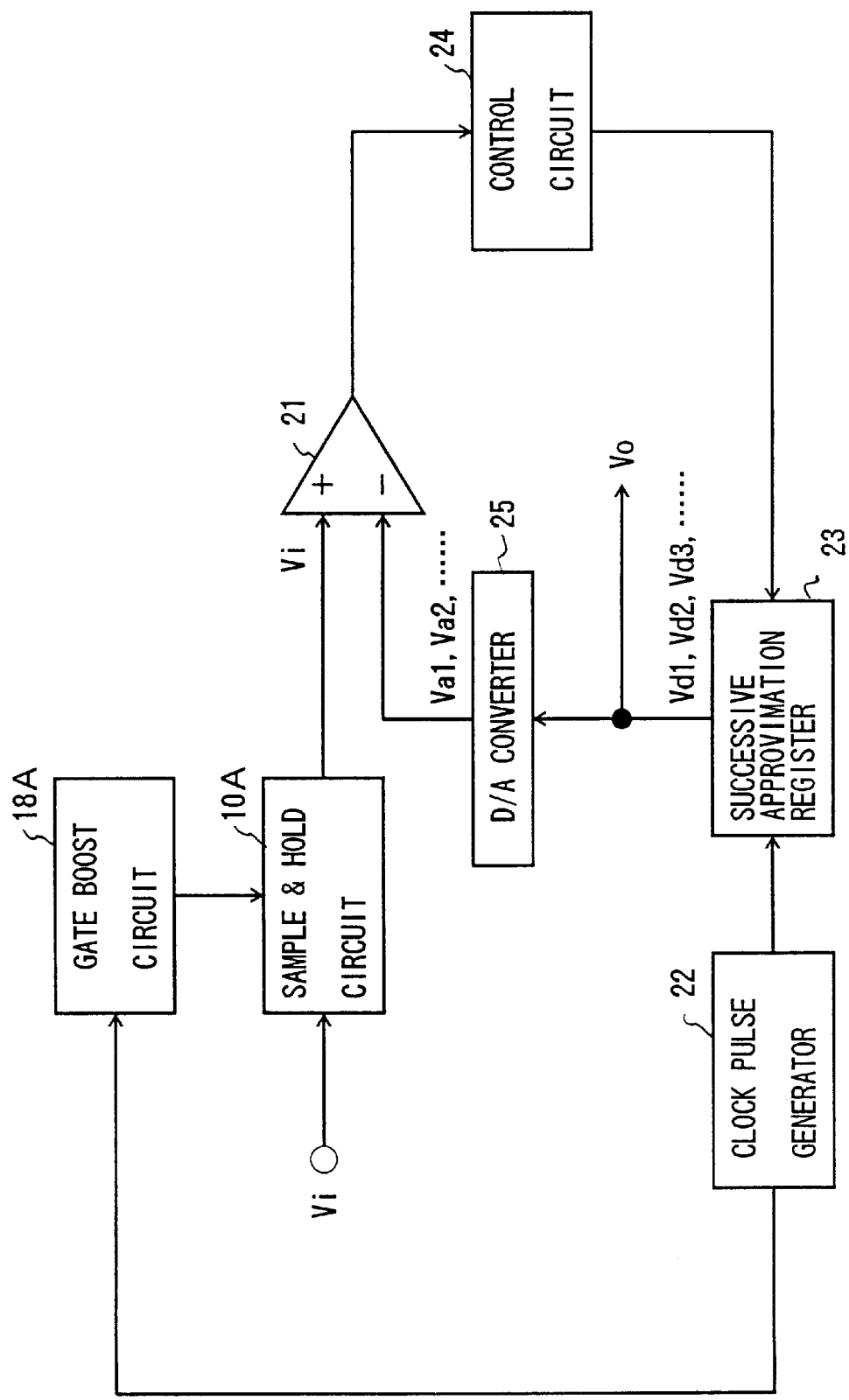
FIG. 3 is a block diagram of a successive approximation type A/D converter.

FIG. 3 is a block diagram of a successive approximation type A/D converter, which can be used as the A/D converter 1 shown in FIG. 2. The A/D converter shown in FIG. 3 includes a sample and hold circuit 10A, a gate boost circuit 18A, a comparator 21, a clock pulse generator 22, a successive approximation register 23, a control circuit 24 and a D/A converter 25.

The sample and hold circuit 10A samples the analog signal (analog input voltage Vi) applied to the A/D converter 1 with the given period, and holds the sampled voltages Vi. The sampled voltages Vi are serially applied to the comparator 21. As will be described later, the sample and hold circuit includes an analog switch and a capacitor for the sample and hold operation. The ON/OFF operation of the analog switch is controlled by a sampling clock pulse (reference pulse) generated by the clock pulse generator 22. When the analog switch is ON, the analog input signal is applied to the sample and hold capacitor via the analog switch provided in the sample and hold circuit 10.

The gate boost circuit 18A boosts the voltage of the sampling clock pulse applied to the analog switch.

The comparator 21 compares the analog signal voltage output by the sample and hold circuit 10A with a signal output by the D/A converter 25.

The clock pulse generator 22 generates the reference pulse, which controls the operation of the successive approximation register 23. The successive approximation register 23 has a circuit portion in which a bit stream of voltage data is stored in binary formation.

The successive approximation type A/D converter 1 operates as follows.

The sample and hold circuit 10A samples the analog input signal (voltage) Vi when the built-in analog switch is turned ON by the sampling clock pulse, and holds the sampled voltage. The control circuit 24 generates an A/D conversion start signal, which is applied to the successive approximation register 23. Then, the most significant bit of the bit stream stored in the register 23 is set to 1. Then, the bit stream in the binary formation having the most significant bit of 1, now labeled Vd1, is sent to the D/A converter 25.

The D/A converter 25 converts the binary data Vd1 from the register 23 into analog (decimal) data Va1, which is supplied to the comparator 21. Then, comparator 1 compares the sampled analog input voltage Vi from the sample and hold circuit 10A with the analog data Va1 from the D/A converter 25, and outputs the comparison result to the control circuit 24.

If Vi>Va, the control circuit 24 supplies the D/A converter 25 with binary data Vd2 in which the second highest bit is set to 1 while the most significant bit is maintained at 1. The data Vd2 is converted into analog data Va2, which is then compared with the analog input voltage Vi by the comparator 21.

If Vi<Va1, the control circuit 24 returns the most significant bit to 0 and sets the second highest bit to 1. Then, the control circuit 24 sends binary data Vd3 thus generated to the D/A converter 25, which converts the binary data Vd3 into analog data Va3. Then, the comparator 21 compares the analog input voltage Vi with the analog data Va3.

The above operation is repeatedly carried out. When each digit of the binary data is set to 0 or 1, the binary data is output as a digital signal Vo from the register 23. In the above-mentioned manner, the analog signal Vi in one cycle is converted into the digital signal Vo.

Figure 1:
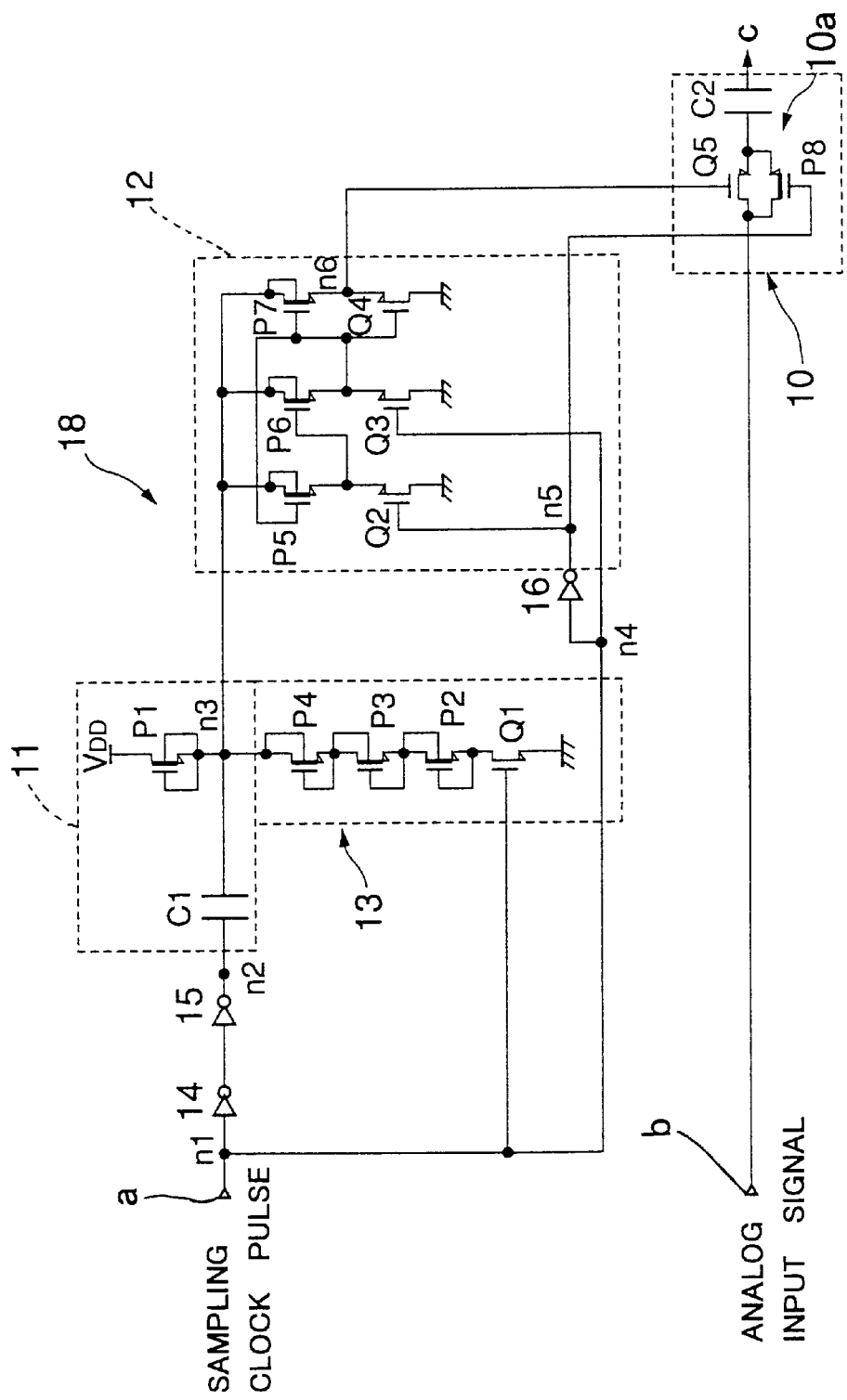
FIG. 1 is a circuit diagram of a sample and hold circuit and a gate boost circuit of a conventional A/D converter.
Figure 4:
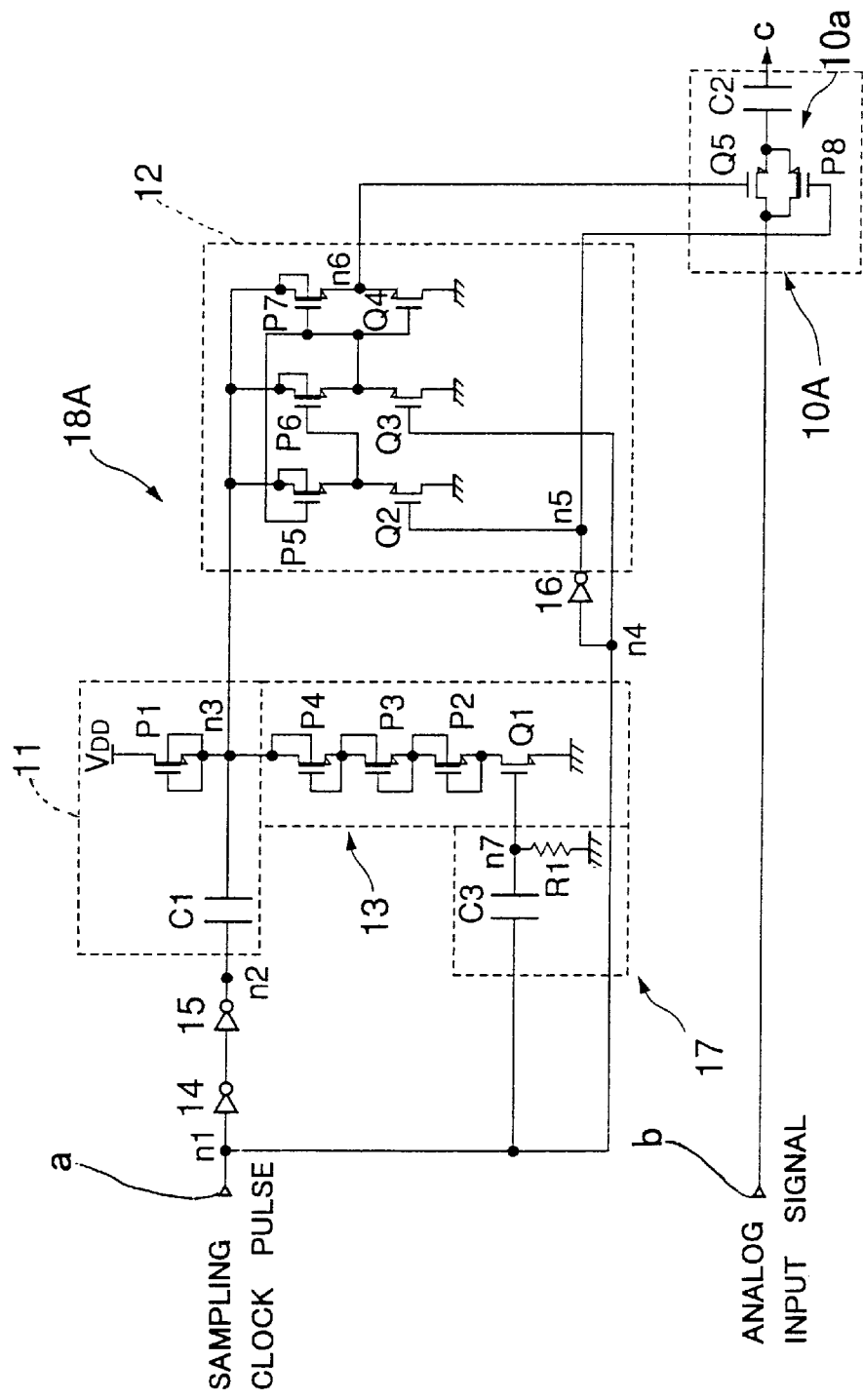
FIG. 4 is a circuit diagram of a first embodiment of the present invention.

FIG. 4 is a circuit diagram of the sample and hold circuit 10A and the gate boost circuit 18A shown in FIG. 3. In FIG. 4, parts that are the same as those shown in FIG. 1 are given the same reference numbers. The sample and hold circuit 10A is made up of the analog switch 10a and the capacitor C2, which are also used in the circuit shown in FIG. 1.

The drain of the transistor Q5 and the source of the transistor P8 are connected to the input terminal b to which the analog input signal Vi is applied. The source of the transistor Q5 and the drain of the transistor P8 are coupled to the output terminal c via the capacitor C2. The gate of the transistor Q5 is connected to the node n6 of the gate boost circuit 18A. The gate of the transistor P8 is connected to the node n5 of the gate boost circuit 18A.

The analog switch 10a controls inputting of the analog input signal to the capacitor C2. The ON/OFF of the analog switch 10a is controlled by the sampling clock pulses supplied from the gate boost circuit 18A and applied to the gates of the transistors Q5 and P8.

When the analog switch 10a is ON, the analog input signal (voltage) Vi passes through the analog switch 10a, and is applied to the capacitor C2. The sample and hold time for which the voltage Vi is held in the sample and hold circuit 10A depends on the time constant of the ON resistance of the analog switch 10a and the capacitance of the capacitor C2.

The gate boost circuit 18A is made up of N-channel transistors Q1, Q2, Q3 and Q4, P-channel transistors P1, P2, P3, P4, P5, P6 and P7, capacitors C1 and C3, and inverters 14, 15 and 16.

The node n1 of the gate boost circuit 18A receives, via the input terminal a, the sampling clock pulse generated by the clock pulse generator 22 shown in FIG. 3. The node n1 is also coupled to the node n2 via the inverters 14 and 15 and to the node n7 via the capacitor C7. Further, the node n1 is connected to the node n4.

The node n3 is connected to the drain and gate of the transistor P1 and the sources of the transistors P4–P7. The power supply voltage VDD connected to the source of the transistor P1 is equal to, for example, the high-level voltage of the sampling clock pulse applied to the input terminal a.

The node n7 is connected to one terminal of a resistor R1 and the gate of the transistor Q1. The other terminal of the resistor R1 is connected to the ground GND. The node n4 is coupled to the node n5 via the inverter 16, and is connected to the gate of the transistor Q3. The node n5 is connected to the gates of the transistors Q2 and P8.

The gate of the transistor P4 is connected to the drain of the transistor P4 and the source of the transistor P3. The gate of the transistor P3 is connected to the drain thereof and the source of the transistor P2. Further, the gate of the transistor P2 is connected to the drain thereof and the drain of the transistor Q1. The source of the transistor Q1 is connected to the ground GND.

The gate of the transistor P5 is connected to the gate of the transistor P7, the drain of the transistor P6, the drain of the transistor Q3 and the gate of the transistor Q4. The drain of the transistor P5 is connected to the gate of the transistor P6 and the drain of the transistor Q2. The node n6 is connected to the drain of the transistor P7, the drain of the transistor Q4 and the gate of the transistor Q5. The sources of the transistors Q2, Q3 and Q4 are connected to the ground GND.

The boost part 11 is made up of the capacitor C1, the transistor P1 and the power supply voltage VDD. The boost part 11 boosts the voltage of the sampling clock pulse applied to the input terminal a. The capacitor C1 of the boost part 11 is a coupling capacitor, which dc-isolates the input terminal a and the node n3 and thus stabilizes the biasing condition. The output voltage of the capacitor C1 is varied as the sampling clock pulse varies.

The level converter 12 is made up of the transistors Q2, Q3, Q4, P5, P6 and P7. The level converter 12 functions to adjust the voltage of the sampling clock pulse boosted by the boost part 11 in order to certainly define the high and low levels applied to the gates of the transistors Q5 and P8 whereby the analog switch 10a is definitely turned ON and OFF.

The clamp part 13 is made up of the transistors Q1, P2, P3 and P4. The clamp part 13 allows the pass-through current to flow therein to the ground GND in order to prevent the voltages respectively applied to the transistors P5, P6, P7 and Q5 if a voltage higher than the given voltage is applied to the node n3 by the boost part 11 from exceeding the respective breakdown voltages. Hence, the voltage of the node n3 can be maintained at the given level.

The differentiating circuit 17 is made up of the capacitor C3 and the resistor R1. The differentiating circuit 17 functions to apply the high-level signal to the gate of the transistor Q1 only when the sampling clock pulse switches to the high level.

The inverters 14, 15 and 16 invert the respective input signals and shape the waveforms thereof.

Figure 5:
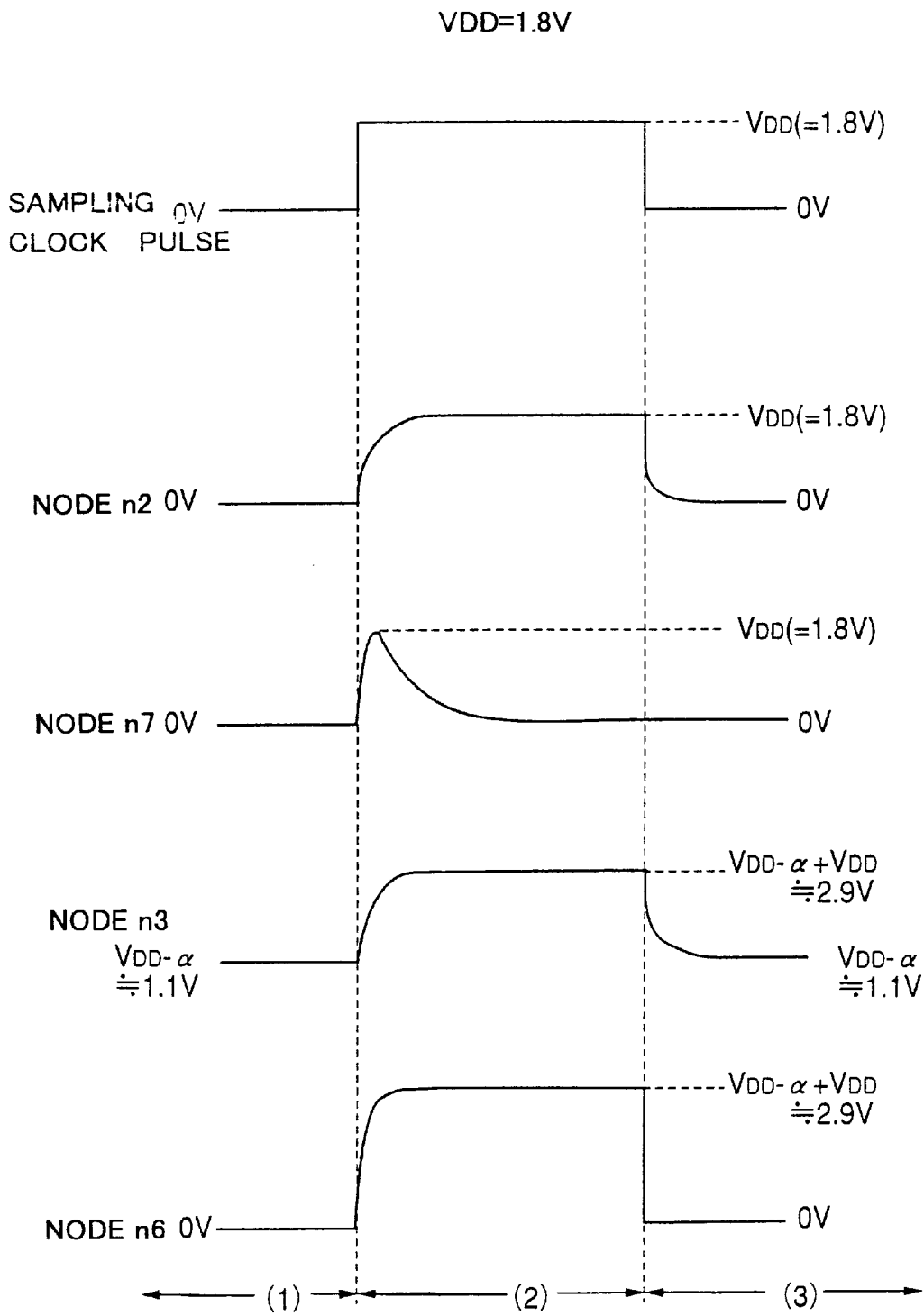
FIG. 5 is a waveform diagram of an operation of the first embodiment of the present invention.

A description will now be given, with reference to FIG. 5, of the operations of the gate boost circuit 18A and the sample and hold circuit 10A. FIG. 5 shows the sampling clock pulse having a high level as low as 1.8 V (VDD=1.8 V), and variations in the voltages of the nodes n2, n3, n6 and n7 of the gate boost circuit 18A. It will assumed that the threshold voltages of the transistors P1 and Q1 are approximately equal to 0.7 V.

The voltages of the nodes n2 and n7 are equal to 0 V during a period (1) for which the sampling clock pulse is at the low level (0 V). During the period (1), the transistor P1 is ON, and the node n3 has a voltage which is lower than the power supply voltage VDD (=1.8 V) by approximately 0.7 V, which is the threshold voltage of the transistor P1. Hence, the voltage of the node n3 is approximately equal to 1.1 V. At this time, the voltage of the node n7 is 0 V, and the gate voltage of the transistor Q1 is also 0 V. Hence, the transistor Q1 is OFF. Thus, the transistors P2, P3 and P4 are OFF and no current flows in the clamp part 13.

When the voltage of the sampling clock pulse is at the low (ground) level, the gate voltage of the transistor Q3 of the level converter 12 is at the low level, and thus the transistor Q3 is OFF. The node n5, the gate voltage of the transistor Q2 and the gate voltage of the transistor P8 are at the high level. Since the transistor P6 is ON, the gate voltages of the transistors Q4, P5 and P7 are equal to a high-level voltage which is lower than the voltage of the node n3 by the threshold voltage of the transistor P6. Hence, the transistors P5 and P7 are OFF, while the transistor Q4 is ON. Since the transistor Q4 is ON, the voltage of the node n6 is at the ground level.

When the voltage of the sampling clock pulse is at the low level equal to 0 V, the low-level voltage is applied to the gate of the transistor Q5 of the analog switch 10a, and the high-level voltage is applied to the gate of the transistor P8 thereof. Hence, the transistors Q and P8 are both OFF, and the analog input signal Vi is not applied to the capacitor C2 of the sample and hold circuit 10A.

During a period (2) for which the voltage of the sampling clock pulse is at the high level equal to 1.8 V (=VDD), the voltage of the node n2 is equal to 1.8 V. Hence, due to the function of the capacitor C1, the voltage of the node n3 is increased by 1.8 V from the voltage approximately equal to 1.1 V and reaches approximately 2.9 V. Since the voltage of the node n3 is boosted to approximately 2.9 V, the gate voltage of the transistor P1 becomes higher than the source voltage thereof. Hence, the transistor P1 is turned OFF.

When the high-level signal is applied to the differentiating circuit 17, the voltage of the node n7 is instantaneously increased up to 1.8 V due to the function of the capacitor C3. At this time, the high-level signal is applied to the gate of the transistor Q1, which is thus turned ON. Hence, the source of the transistor Q1 is decreased to the ground level. Thus, the gate voltage of the transistor P2 is switched to the low level, and is thus turned ON. Further, the transistors P3 and P4 are turned ON.

The sum Vth of the threshold voltages of the transistors Q1, P2, P3 and P4 assumes a voltage slightly higher than 2.9 V. Hence, in the case where VDD=1.8 V, even if the transistors Q1, P2, P3 and P4 are turned ON, the voltage of the node n3 is approximately equal to 2.9 V, and no current flows in the clamp part 13. Thus, the voltage of the node n3 is maintained at 2.9 V.

After the voltage of the node n7 is instantaneously increased to 1.8 V, a current flows to the ground GND through the resistor R1. Thus, the voltage of the node n7 is returned to 0 V. Hence, the gate voltage of the transistor Q1 is decreased to the 0 V, and is thus turned OFF. Further, the transistors P2, P3 and P4 are turned OFF.

When the sampling clock pulse of 1.8 V is applied to the input terminal a, the voltage of the node n4 is high. Thus, the transistor Q3 is turned ON. At this time, the voltage of the node n5 connected to the input terminal a via the inverter 16 is at the low level. Hence, the transistor Q2 is turned OFF, while the transistor P8 is turned ON. Since the transistor Q3 is turned ON, the gate voltages of the transistors Q4, P5 and P7 are changed to the ground level. Thus, the transistor Q4 is turned OFF, and the transistors P5 and P7 are turned ON. Since the transistor P7 is turned ON and the transistor Q4 is turned OFF, the voltage of the node n6 is changed to a level which is lower than the voltage of the node n3 approximately equal to 2.9 V by the threshold voltage of the transistor P7.

Hence, the gate voltage of the transistor Q5 is changed to the high level, while the gate voltage of the transistor P8 is changed to the low level. Thus, the transistors Q5 and P8 are both turned ON, and the analog input signal applied to the input terminal b reaches the capacitor C2 of the sample and hold circuit 10a.

During a period (3) for which the voltage of the sampling clock pulse is returned to 0 V, the voltage of the node n2 is returned to 0 V. Hence, due to the function of the capacitor C1, the voltage of the node n3 is decreased. At this time, the gate voltage of the transistor P1 is decreased and the transistor P1 is turned ON. Hence, the voltage of the node n3 is changed to approximately 1.1 V, which is lower than the power supply voltage of 1.8 V by the threshold voltage of the transistor P1 approximately equal to 0.7 V. During the period (3), the node n7 is discharged to the ground GND via the resistor R1, and becomes approximately equal to 0 V.

Since the voltage of the node n4 is changed to the low level again, and the voltage of the node n3 becomes approximately equal to 1.1 V, the level converter 12 functions in the same manner as in the case of the period (1). Hence, the voltage of the node n6 is changed to the low level, and the voltage of the node n5 is changed to the high level. At this time, the transistors Q5 and P8 are both OFF, and thus the analog switch 10a is OFF. Hence, the voltage Vi of the analog input signal applied to the capacitor C2 during the period (2) is maintained in the capacitor C2.

Figure 6:
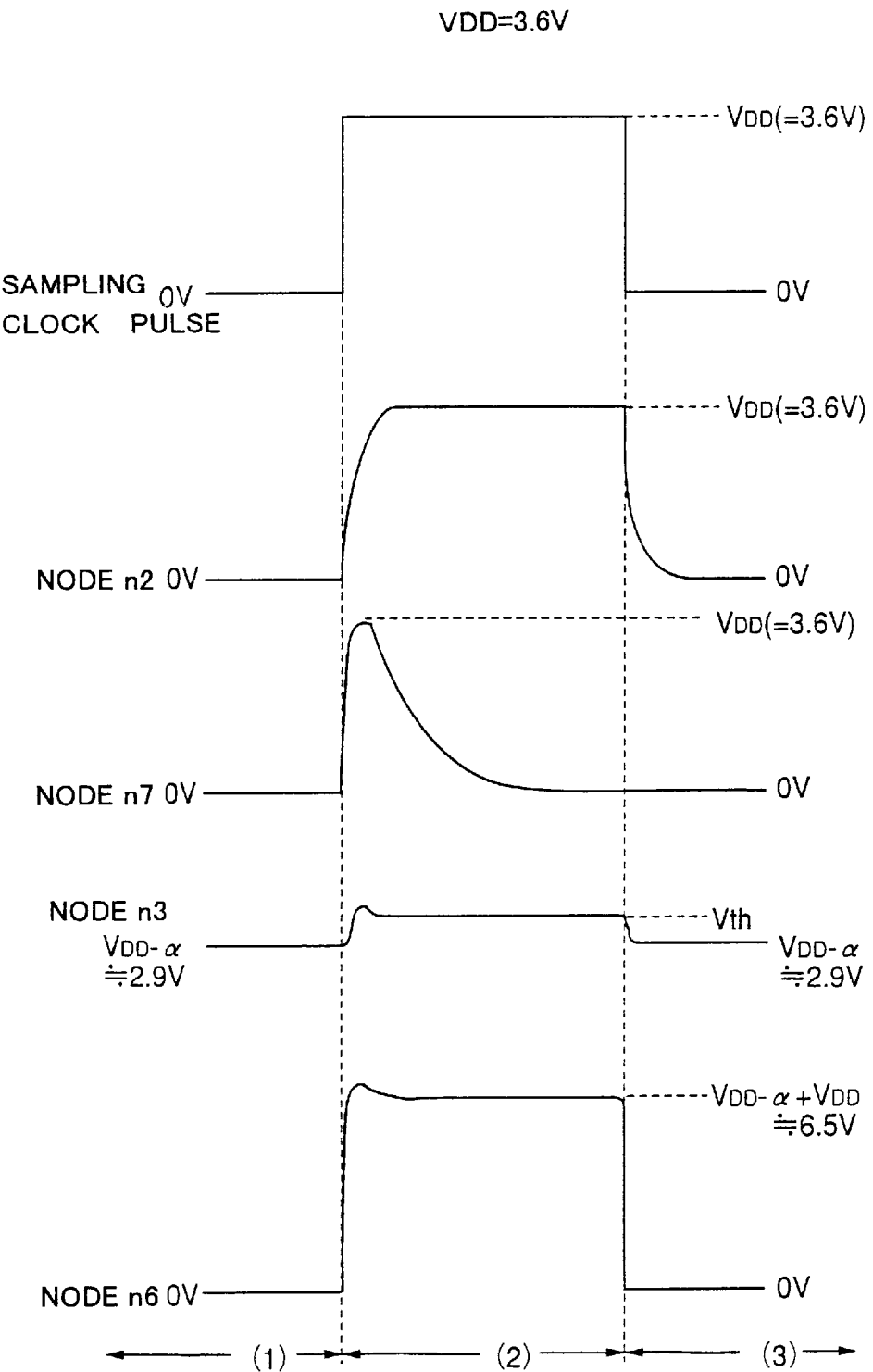
FIG. 6 is a waveform diagram of another operation of the first embodiment of the present invention.

FIG. 6 is a timing chart showing the sampling clock pulse having a high level as high as 3.6 V (=VDD) and variations in the voltages of the nodes n2, n3, n6 and n7 of the gate boost circuit 18A.

During the period (1) for which the voltage of the sampling clock pulse is equal to 0 V, the voltages of the nodes n2, n7 and n4 are equal to 0 V. The transistor P1 is ON and the voltage of the node n3 is approximately equal to 2.9 V, which is lower than the power supply voltage VDD of 3.6 V by the threshold voltage of the transistor P1. At this time, the gate voltage of the transistor Q1 is 0V, and thus the transistor Q1 is OFF. Hence, the transistors P2, P3 and P4 are OFF, and no current flows in the clamp part 13.

When the sampling clock pulse is at the low level, the gate voltage of the transistor Q3 is low and is thus OFF. The voltage of the node n5 and the gate voltages of the transistors Q2 and P8 are high. Since the gate voltage of the transistor Q2 is at the high level, the transistor Q2 is thus ON and the gate voltage of the transistor P6 is at the ground level GND. Hence, the transistor P6 is ON. Thus, the gate voltages of the transistors Q4, P5 and P7 become equal to a level which is lower than the voltage of the node n3 by the threshold voltage of the transistor P6. Hence, the transistors P5 and P7 are OFF, and the transistor Q4 is ON. Since the transistor Q4 is ON, the voltage of the node n6 is changed to the ground level GND.

Hence, the low-level voltage is applied to the gate of the transistor Q5 of the analog switch 10a and the high-level voltage is applied to the gate of the transistor P8 during the period (1) for which the sampling clock pulse is at 0 V. Hence, the transistors Q5 and P8 are both OFF, and the analog input signal does not reach the capacitor C2.

During the period (2) for which the voltage of the sampling clock pulse is equal to 3.6 V (=VDD), the voltage of the node n7 is increased to 3.6 V due to the function of the capacitor C3 at the moment the sampling clock pulse of 3.6 V is input. Hence, the transistor Q1 is turned ON. Successively, the transistors P2, P3 and P4 are turned ON.

The voltage of the node n2 becomes equal to 3.6 V (=VDD). Hence, the capacitor C1 operates towards increasing of the voltage of the node n3 to 6.5 V from approximately 2.9 V. However, at that time, all the transistors of the clamp part 13 are ON, and thus the pass-through current flows to the ground GND from the node n3 via the clamp part 13. Hence, it is possible for the voltage of the node n3 to exceed the sum Vth of the threshold voltages of the transistors Q1, P2, P3 and P4 and to prevent the transistors P5, P6 and P7 from receiving voltages higher than the respective breakdown voltages.

After the voltage of the node n7 instantaneously increases up to 3.6V, the current flows to the ground GND through the resistor R1, and the voltage of the node n7 is returned to 0 V again. Hence, the gate voltage of the transistor Q1 becomes equal to 0 V, and the transistor Q1 is thus turned OFF. Further, the transistors P2, P3 and P4 are turned OFF. The transistor Q1 is ON until the gate voltage of the transistor Q1 is decreased down to approximately 0.7 V, which is the threshold voltage thereof.

When the sampling clock pulse of 3.6 V is input, the voltage of the node n4 is high, and the gate voltage of the transistor Q3 is high. At this time, the gate voltages of the transistors Q2 and P8 become low. Hence, the transistor Q2 is turned OFF, while the transistors Q3 and P8 are turned ON.

Since the transistor Q3 is turned ON, the gate voltage of the transistors Q4, P5 and P7 become equal to the ground level GND. Thus, the transistor Q4 is turned OFF, while the transistors P5 and P7 are turned ON. Thus, the voltage of the node n6 is lower than the voltage of the node n3 by the threshold voltage of the transistor P7.

Thus, the gate of the transistor Q5 is at the high level, and the gate of the transistor P8 is at the low level. Thus, the transistors Q5 and P8 are both turned ON. Hence, the analog input signal reaches the capacitor C2.

During the period (3) for which the voltage of the sampling clock pulse returns 0 V, the voltage of the node n2 becomes equal to 0 V through the inverters 14 and 15. Hence, due to the function of the capacitor C1, the voltage of the node n3 is decreased. At this time, the gate voltage of the transistor P1 is decreased, and the transistor P1 is turned ON again. Hence, the voltage of the node n3 becomes approximately equal to 2.9 V, which is lower than the power supply voltage of 3.6 V by 0.7 V which is the threshold voltage of the transistor P1.

During the period (3), the voltage of the node n7 is already equal to approximately 0 V because the current flows to the ground GND through the resistor R1.

The voltage of the node n4 becomes equal to the low level again, and the voltage of the node n3 becomes approximately equal to 2.9 V. Hence, the level converter 12 functions in the same manner as that during the period (1). Hence, the voltage of the node n6 becomes low, while the voltage of the node n5 becomes high. At this time, the transistors Q5 and P8 are both turned OFF, and thus the analog switch 10a is OFF. Hence, the voltage Vi of the analog input signal which reaches the capacitor C2 in the period (2) is held in the capacitor C2.

As described above, the sampling clock pulse enters the differentiating circuit 17 and is then applied to the gate of the transistor Q1. Hence, the transistor Q1 is ON only at the moment the voltage of the sampling clock pulse rises. Hence, the gate boost circuit 18A limits or reduces the time period during which the current passes through the clamp part 13, so that the amount of power consumed therein can be reduced and the signal voltage applied to the gates of the transistors of the analog switch 10a can be boosted within the tolerable range less than the breakdown voltage. Since the gate voltage is boosted and thus the ON resistance of the analog switch 10a can be reduced. Thus, the A/D converter formed of transistors having a relatively low breakdown voltage can operate with the sampling clock pulse having a relatively low voltage.

Figure 7:
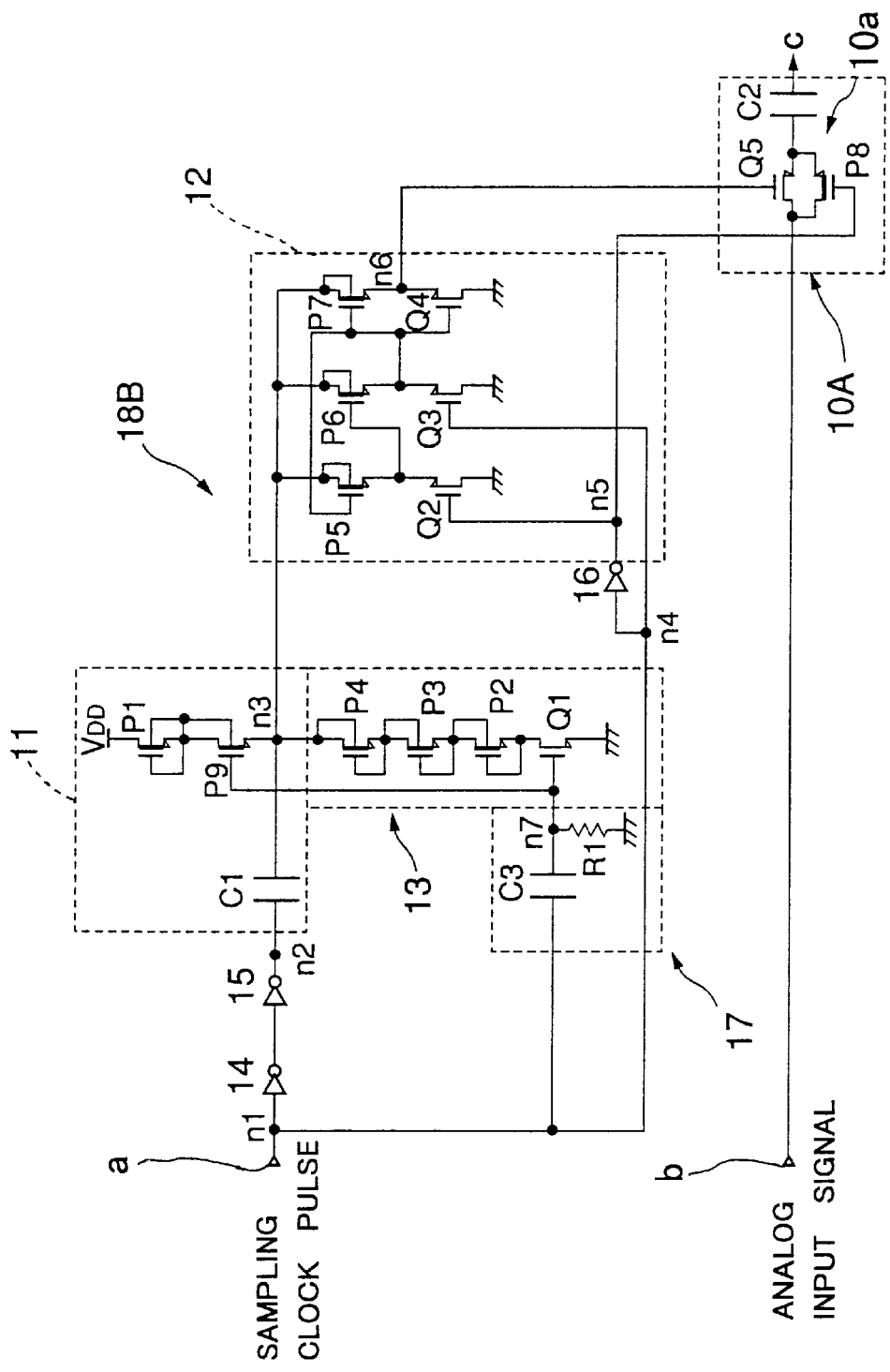
FIG. 7 is a circuit diagram of a second embodiment of the present invention.

FIG. 7 is a circuit diagram of the sample and hold circuit 10A and a gate boost circuit 18B of an A/D converter according to a second embodiment of the present invention. In FIG. 7, parts that are the same as those shown in the previously described figures are given the same reference numbers.

The gate boost circuit 18B is configured by adding a P-channel transistor P9 to the gate boost circuit 10A used in the first embodiment of the present invention. As shown in FIG. 7, the gate, source and drain of the transistor P9 are respectively connected to the node n7, the drain of the transistor P1 and the node n3. The back gates of the transistors P1 and P9 are connected together. The remaining configuration of the gate boost circuit 18B is the same as that of the gate boost circuit 10A, and a description thereof will be omitted.

The sampling clock pulse is applied to the input terminal a. At the moment the voltage of the node n7 is changed to the high level, the transistor P9 is turned OFF. At this time, the transistor Q1 is ON as has been described with respect to the first embodiment of the present invention. When the transistor Q1 is ON and the pass-through current flows in the clamp part 13, the transistor P9 is OFF, so that the power supply voltage VDD can be prevented from being applied to the node n3.

When the voltage of the sampling clock pulse becomes equal to 0 V or when the current from the node n7 flows to the ground and the voltage of the node n7 is switched to the low level, the transistor P9 is turned ON and the transistor Q1 is turned OFF. The transistor P9 is turned ON, and thus the voltage VDD is applied to the node n3. However, transistor Q1 is OFF and thus no current flows in the clamp part 13.

Hence, the transistor P9 functions as a switch of the boost part 11, and does not simultaneously operate the boost part 11 and the clamp part 13. Hence, the pass-through current can be prevented from flowing through the clamp part 13 from the power supply voltage VDD to the ground GND. Hence, a further reduction in power consumption can be achieved.

Figure 8:
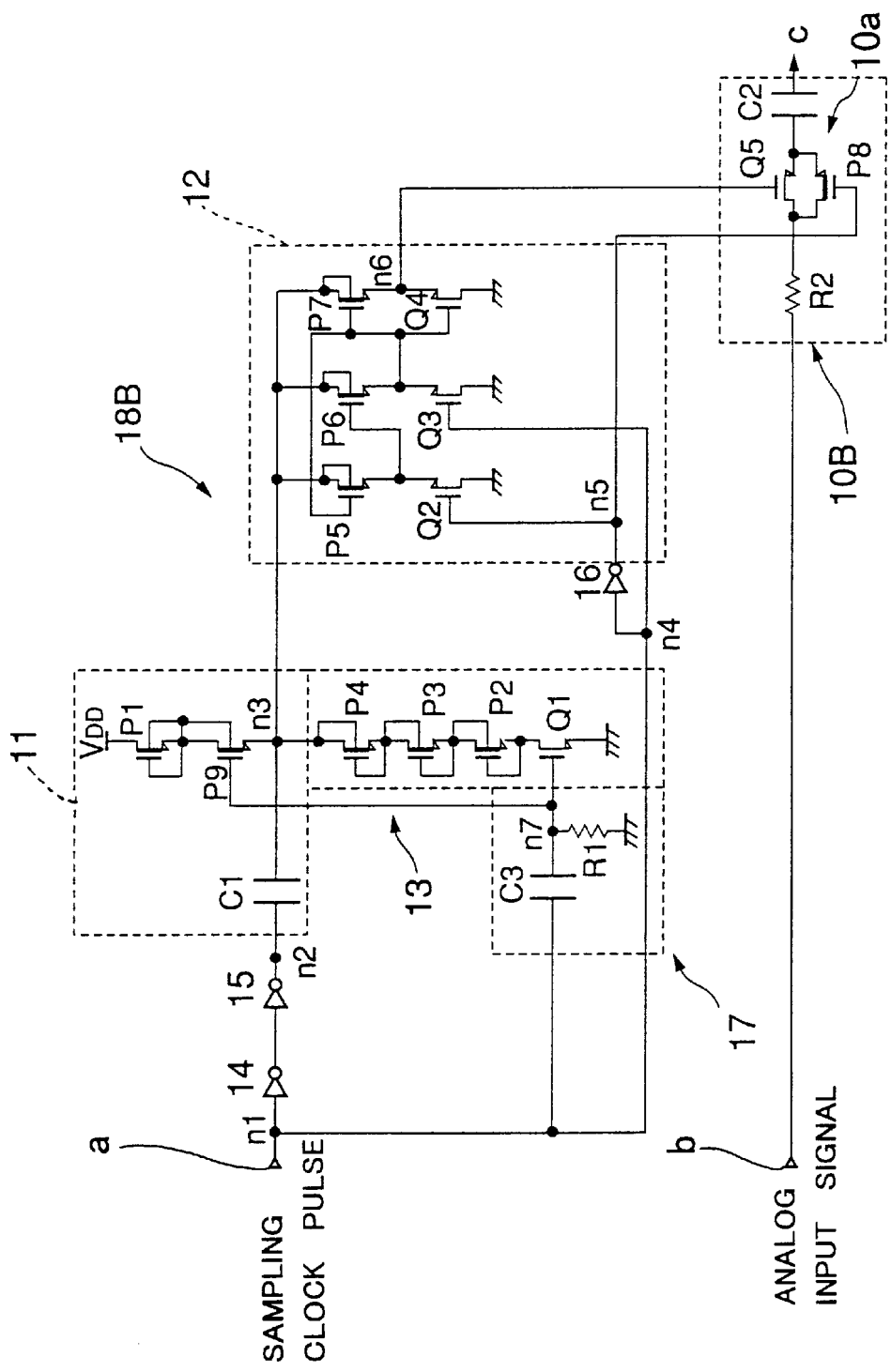
FIG. 8 is a circuit diagram of a third embodiment of the present invention.

FIG. 8 is a circuit diagram of a sample and hold circuit 10B and the gate boost circuit 18B of an A/D converter according to a third embodiment of the present invention. In FIG. 8, parts that are the same as those shown in the previously described figures are given the same reference numbers.

The sample and hold circuit 10B is configured by adding a resistor R2 to the aforementioned sample and hold circuit 10A. As shown in FIG. 8, the resistor R2 is provided at the side of the input terminal b of the analog switch 10a and is connected in series to the analog switch 10a. The remaining configuration of the sample and hold circuit 10B is the same as sample and hold circuit 10A.

In the sample and hold circuit 10A which does not have the resistor R2, the channel resistances of the transistors Q5 and P8 function as a filter which eliminates high-frequency components of external noise applied to the input terminal b.

In the sample and hold circuit 10B, the resistor R2 connected in series to the analog switch 10a functions as a filter. Hence, the channel resistances of the transistors Q5 and P8 can be reduced by the resistance of the resistor R2. Hence, it is possible to prevent the performance of the A/D converter due to derivations in factors introduced during the production process from being varied and to reduce the channel widths of the transistors Q5 and P8 which are conventionally directed to increasing in order to reduce noise.

As the widths of the transistors Q5 and P8 are minimized, the threshold voltages of the transistors Q5 and P8 are minimized, so that the sample and hold circuit operates with a further reduced voltage.

The sample and hold circuit 10B can be modified so that the resistor R2 is disposed to the side of the output terminal c of the analog switch 10a. The sample and hold circuit 18B can be used in combination with the gate boost circuit 18A used in the first embodiment of the present invention.

The present invention is not limited to the specifically disclosed embodiments, and variations and modifications may be made without departing from the scope of the present invention.

What is claimed is:

1. A semiconductor device comprising:
   a sample and hold circuit which has an analog switch and a first capacitor and which samples and holds an analog input signal; and
   a boost circuit which has a boost part which boosts a sampling clock pulse and a clamp part which limits a boosted voltage to a predetermined level, the sample and hold circuit operating a boosted sampling clock pulse,
   said boost circuit comprising a control circuit which operates the clamp part only at the moment the sampling clock pulse changes to a high level.

2. The semiconductor device as claimed in claim 1, wherein:
   the control part comprises a differentiating circuit which differentiates the sampling clock pulse; and
   the clamp circuit being operated based on an output signal of the differentiating circuit.

3. The semiconductor device as claimed in claim 2, wherein the differentiating circuit comprises a second capacitor and a resistor.

4. The semiconductor device as claimed in claim 1, wherein the boost part comprises:
   a second capacitor; and
   a P-channel transistor having a gate which receives the sampling clock pulse via the second capacitor, a source receiving a power supply voltage, and a drain connected to the clamp part.

5. The semiconductor device as claimed in claim 4, wherein a differentiating circuit is provided which comprises a third capacitor and a resistor.

6. The semiconductor device as claimed in claim 1, wherein the boost part comprises:
   a second capacitor;
   a first P-channel transistor having a first gate, a first source receiving a power supply voltage, a first drain connected to the first gate; and
   a second P-channel transistor having a second gate connected to the first gate and the control circuit, a second source connected to the first drain, and a second drain receiving the sampling clock pulse via the second capacitor.

7. The semiconductor device as claimed in claim 6, wherein a differentiating circuit is provided which comprises a third capacitor and a resistor.

8. The semiconductor device as claimed in claim 1, wherein the sample and hold circuit comprises a resistor via which the analog input signal is applied to the first capacitor via the analog switch.

9. The semiconductor device as claimed in claim 1, wherein:
   the analog switch comprises a P-channel transistor and an N-channel transistor; and
   gates of the P-channel and N-channel transistors are controlled based on the boosted sampling clock pulse.

10. The semiconductor device as claimed in claim 1, further comprising a level converter which changes the boosted sampling clock pulse to a given level.

11. The semiconductor device as claimed in claim 1, wherein the control circuit prevents the boost part and the clamp part from simultaneously operating.

* * * * *